United States Patent
Becker et al.

(10) Patent No.: US 7,400,227 B2
(45) Date of Patent: Jul. 15, 2008

(54) FIRE ALARM NOTIFICATION POWER SUPPLY WITH CONFIGURABLE NOTIFICATION APPLIANCE CIRCUITS AND AUXILIARY POWER CIRCUITS APPARATUS AND METHOD

(75) Inventors: Donald E. Becker, Bradenton, FL (US); John P. Hewlin, Bradenton, FL (US); Clifford D. Renfrew, Owen Sound (CA)

(73) Assignee: GE Security, Inc., Bradenton, FL (US)

( * ) Notice: Subject to any disclaimer, the term of this patent is extended or adjusted under 35 U.S.C. 154(b) by 250 days.

(21) Appl. No.: 11/193,371

(22) Filed: Aug. 1, 2005

(65) Prior Publication Data

US 2007/0001819 A1    Jan. 4, 2007

Related U.S. Application Data

(60) Provisional application No. 60/694,995, filed on Jun. 30, 2005.

(51) Int. Cl.
*G08B 17/00* (2006.01)
*G08B 21/00* (2006.01)

(52) U.S. Cl. .......... 340/286.05; 340/635; 340/693.1; 340/693.3; 340/693.4; 340/693.5; 340/664

(58) Field of Classification Search .............. None
See application file for complete search history.

(56) References Cited

U.S. PATENT DOCUMENTS

| | | | | |
|---|---|---|---|---|
| 6,603,644 | B2 * | 8/2003 | Yeh | 361/31 |
| 2004/0026533 | A1 * | 2/2004 | MacDonald et al. | 239/209 |
| 2005/0140077 | A1 * | 6/2005 | Takamura et al. | 270/58.09 |
| 2006/0139830 | A1 * | 6/2006 | Hirayama | 361/93.1 |

* cited by examiner

*Primary Examiner*—Julie Lieu
(74) *Attorney, Agent, or Firm*—Baker & Hostetler LLP

(57) ABSTRACT

A power supply for providing excitation to notification appliance circuits (NACs) in fire alarm applications meets revised national and international requirements for both NAC drive and auxiliary load drive tasks with a single circuit configuration. The requirements stipulate ability to tolerate inrush when activating strobe lights and horns of ten times the nominal output, while limiting short-circuit drive in AUX mode to eight amperes after five seconds. The novel power supply improves on the requirements, first by continuously testing for overcurrent NAC status and signaling faults in real time, and second by shutting off AUX drive in event of a short and retrying periodically without a requirement for manual reset. Thus testing for wiring errors is rendered safer and nondestructive, and correction of a wiring error can be quicker.

16 Claims, 4 Drawing Sheets

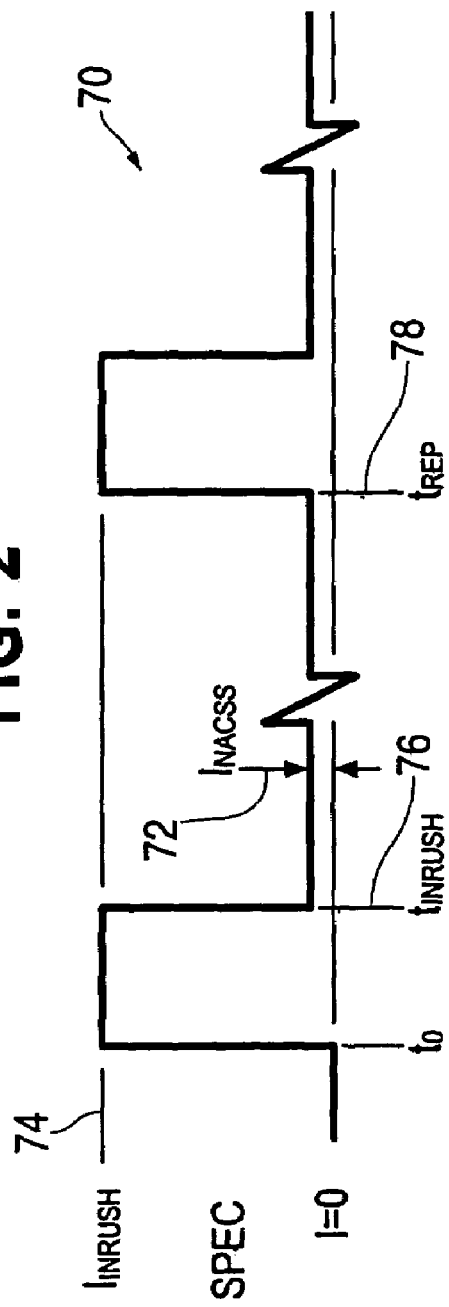

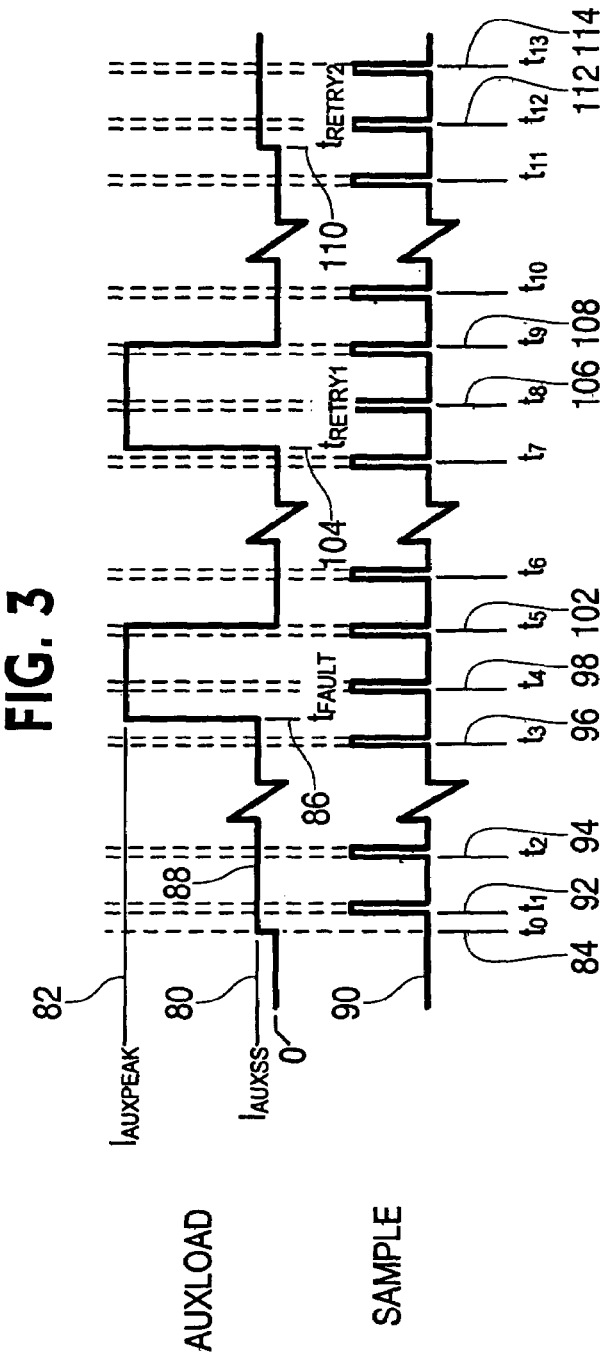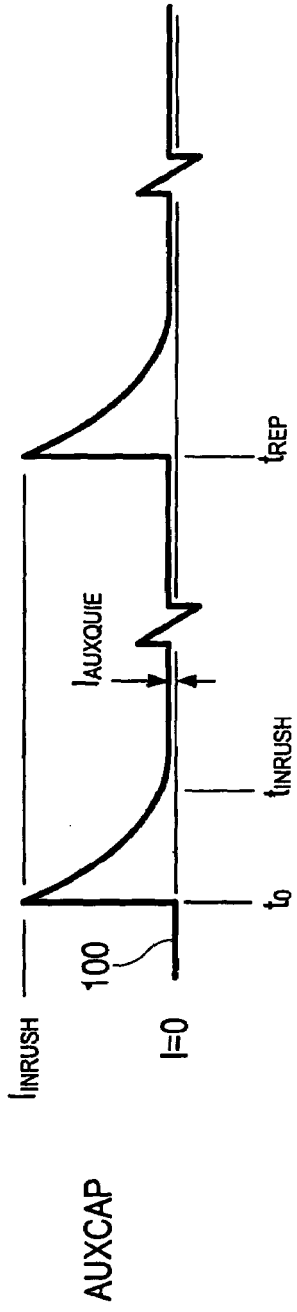

FIRE ALARM NOTIFICATION POWER SUPPLY WITH CONFIGURABLE NOTIFICATION APPLIANCE CIRCUITS AND AUXILIARY POWER CIRCUITS APPARATUS AND METHOD

CLAIM OF PRIORITY

This application claims priority to U.S. Provisional Application entitled, "FIRE ALARM NOTIFICATION POWER SUPPLY WITH CONFIGURABLE NOTIFICATION APPLIANCE CIRCUITS AND AUXILIARY POWER CIRCUITS APPARATUS AND METHOD", filed Jun. 30, 2005, having Ser. No. 60/694,995, which is hereby incorporated by reference in its entirety.

FIELD OF THE INVENTION

The present invention relates generally to electronic functions used in fire alarm circuits. More particularly, the present invention relates to control functions for power supply elements used for actuation of fire alarm devices.

BACKGROUND OF THE INVENTION

Fire alarms are characteristically robust electrical/electronic devices, expected to resist abuse and events such as installer error, while maintaining functionality for extended periods with minimal maintenance. Typical fire alarm apparatus may employ automated sensors as triggering devices, which can include detectors for such hazards as smoke, heat, toxic vapor, and combustion products, along with manually actuated alarm stations. In addition to signal inputs, a fire alarm system necessarily includes outputs. Outputs can include, depending on the requirements of an application, acoustical, visual, and/or other signals distributed throughout a facility, message transmitters directed to emergency responders, facility managers, and the like, actuators such as fire door auto-closure functions, security lock releases, manufacturing process shutdown command signals, and such other functions as may be dictated by the requirements of an individual application.

Fire alarm systems typically employ premises power sources—nominal 115 or 230 VAC at 50 or 60 Hz single-phase is widely available—for normal operation of entire systems. Higher-power sources and specialty supplies can be incorporated where needed or preferentially available, such as DC, three-phase AC, a non-standard supply voltage or frequency, or the like.

Fire alarm system internal electronics generally employ power having a configuration appropriate for the technology. Thus, earlier systems may have used, for example, relays powered directly from premises power to actuate notification appliances—light and/or sound generators—distributed throughout a facility, while many successor systems have adopted DC power at lower voltages for their less power-demanding but more effective equivalent appliances. With the adoption of intrinsically safe low voltage DC power to actuate high-efficiency strobe lights and horns, a need to employ licensed electricians to install and maintain system components has diminished, potentially reducing costs.

Designs for applying power to notification appliance circuits (NACs) and auxiliary (AUX) functions of fire alarm electronics using distribution wiring are subject to laws in many jurisdictions, as well as to regulations and conventions that may have the force of law. Marketing pressure may likewise dictate particular approaches to apparatus design, in consideration of compatibility between vendors, regional and worldwide standards, cost, and other issues. For example, any telephone "dialer" device is likely to use a dual tone, multi-frequency (DTMF) code sequence, as originally developed by Bell Laboratories and now adopted substantially universally, to initiate all calls.

New regulations are scheduled for imminent adoption, both within the U.S. and in jurisdictions such as Canada, for which harmonization with U.S. regulations is largely in force. These regulations stipulate fire alarm circuit performance attributes such as transient current draw during normal NAC operation and short circuit foldback current versus time for AUX operation. While multiple alternatives are possible to address these regulations, many obvious solutions to implement the regulations are undesirably costly or complex. Similarly, conventional, non-regulation based technical solutions, such as use of manually reset protective devices, may be undesirable in a competitive and convenience-oriented marketplace.

Accordingly, it is desirable to provide a method and apparatus for supplying actuation power to distributed fire alarm notification appliance circuits and auxiliary loads whereby high transient current survival, intelligent power foldback, and automatic foldback recovery coexist in an economically practical configuration.

SUMMARY OF THE INVENTION

The foregoing needs are met, to a great extent, by the present invention, wherein an apparatus is provided that in some embodiments provides adaptive circuit operation to conform to load configuration for a power supply capable of driving either a Notification Appliance Circuit or an Auxiliary Power Circuit in a fire alarm system, and that further responds to load errors with convenient and protective safing functions.

In accordance with one embodiment of the present invention, a fire alarm notification appliance circuit power supply with overload protection is presented. The power supply includes a driver circuit configured to apply power to an electrical load, a first current limited drive enable circuit configured to activate the driver circuit and to establish a first upper drive limit for the driver circuit, a second current limited drive enable circuit configured to activate the driver circuit and to establish a second upper drive limit for the driver circuit, a drive limit selection criterion, and a drive control function, wherein a drive limit imposed on the driver circuit is determined at least in part by the selection criterion.

In accordance with another embodiment of the present invention, a method for applying power with overload protection to a notification appliance circuit is presented. The method includes providing power to an electrical load, establishing a first current limited enablement for providing power to the electrical load, establishing a second current limited enablement for providing power to the electrical load, providing a criterion for selection between the first enablement and the second enablement, and controlling drive current applied to the load, wherein selection of an enablement current limit is determined at least in part by the criterion for selection.

There have thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as in the abstract, are employed for the purpose of description and should not be regarded as limiting.

As such, those skilled in the art will appreciate that the conception upon which this disclosure is based may readily be used as a basis for the designing of other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 2 is a flow diagram for control logic related to initialization functions for a notification appliance circuit power supply.

FIG. 3 is a timing diagram for signals related to actuation and protection functions for a notification appliance circuit power supply.

FIG. 4 is a waveform drawing representing capacitive inrush for a notification appliance circuit power supply.

DETAILED DESCRIPTION OF THE PREFERRED EMBODIMENT

Figure 1:
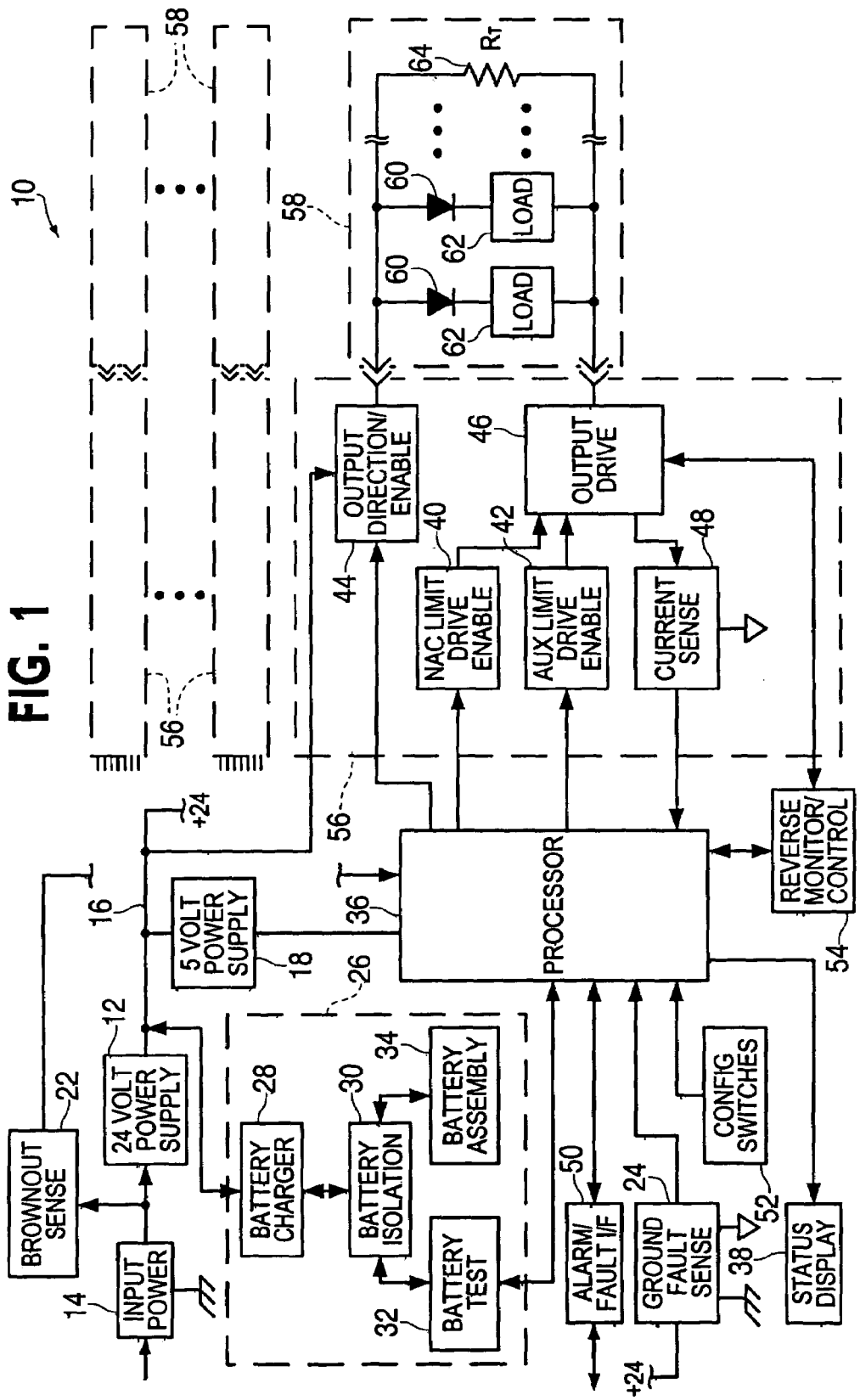
FIG. 1 is a hardware block diagram illustrating hardware and control logic related to actuation and protection functions for a notification appliance circuit power supply.

The invention will now be described with reference to the drawing figures, in which like reference numerals refer to like parts throughout. An embodiment in accordance with the present invention provides a power supply for activating at least one fire alarm notification appliance circuit (NAC), wherein the drive circuit for NAC activation has transient overload tolerance for output current. The embodiment further includes NAC line integrity sensing. The embodiment further includes short circuit protection for one or more auxiliary (AUX) output drive function loads, wherein the AUX output is realized by repurposing a NAC drive function. The embodiment, whether used for NAC or repurposed for AUX applications, uses a single set of hardware supported and controlled by programmable control components. The power supply circuit hardware operation and associated control logic flow satisfy performance requirements imposed by recognized standards agencies and accepted by insurers for fire safety equipment.

FIG. 1 shows, in block diagram form, a hardware embodiment of a power supply 10 incorporating the inventive apparatus. The power supply 10 embodiment shown performs input power conversion 12, accepting premises input power 14, and regulating the input power 14 to provide power 16 for use within the power supply 10 and for use as NAC and AUX drive power, as addressed further below. The specific embodiment shown further includes subregulation 18 for another voltage level 20 required within the power supply 10.

In other embodiments, functions within the power conversion block 12 may be performed in whole or in part according to other configurations without significantly affecting overall power supply 10 functionality, and may include additional power conversion functions as appropriate. For example, external power level transformation, additional voltage regulators or subregulators beyond the single respective functional blocks shown, and the like, may be preferred in some embodiments.

FIG. 1 further shows brownout 22 and ground fault 24 detection functions. Similarly to the above discussion, additional input power defect detection and reporting functions may be desirable in some embodiments, such as detection of overvoltage surges, power line frequency errors, and the like.

FIG. 1 further shows a backup battery function 26, including a battery charger 28, a battery isolation relay 30 to permit battery test 32 isolated from the charger 28, and a battery assembly 34. These functions may be performed in whole or in part externally to the power supply 10 in some embodiments. Where heavy loads or long periods of operation in battery backup mode are likely, for example, a battery cabinet external to an enclosure for the power supply 10 electronics may be preferable for housing an oversized equivalent to the internally-mounted battery assembly 34 of FIG. 1.

FIG. 1 further shows a processor functional block 36, an externally visible status display 38, a first output drive level setting function 40, a second output drive level setting function 42, an output enable relay 44, an output drive circuit 46, and a current sense function 48. The processor block 36 may in some embodiments include a single-chip microcontroller or equivalent functional device, one or more internal or external data registers, multiplexers, drivers, storage devices for configuration, operational commands, or data, and converters for functions such as analog inputs and outputs. FIG. 1 further shows a bidirectional alarm command and fault signal interface 50.

Either the first or the second current limited output enable function 40 or 42, respectively, can be selected to activate and limit current provided by the output drive circuit 46. Selection between the respective output enable functions 40 and 42 may use configuration storage 52 in the form of manual switches read by the processor 36 or in other forms, such as semiconductor memory. In embodiments having multiple driver subsystems 56 in a power supply 10, as shown in FIG. 1, each driver subsystem 56 may be provided with separate elements within configuration storage 52 to select a current limit for the respective output drive circuit 46.

It is to be understood that providing, within a single product 10, selection between two current limiting output enable functions 40 and 42, respectively, plus a zero-output state activated by dynamically controlling the selected output enable function 40 or 42, is an inventive combination that satisfies existing and anticipated regulations regarding NAC load drive and AUX load protection in fire alarm applications. Other embodiments employing the invention may be directed to applications conforming to other sets of requirements. For such embodiments, different current limit settings and different numbers of current limit functions—or, indeed, control for voltage or another circuit property—may be preferred. Internally controlled test event timing, described below, operating in coordination with the plurality of current limiting output enable functions, establishes functionality in accordance with the invention.

NAC functionality, as specified by typical fire protection regulations, includes monitoring of NAC 58 wiring integrity using diode 60 isolation of each appliance load 62. In at least some configurations, a termination resistor $R_T$ 64 can be connected either at the distal end of each NAC 58 wiring string, as shown in FIG. 1, or using another suitable arrangement. Suitable configurations can permit reverse polarity power to be applied to the NAC 58 to detect open or shorted NAC 58 wiring strings by sensing the current through $R_T$ 64 while power is applied using the reverse monitor/control 54. For example, with a nominal 24-volt signal applied using a reverse monitor/control 54 that includes a divider resistor string, a test of a normal NAC 58 may show a few volts dropped across the $R_T$ 64 termination and the remainder across the divider resistors in the reverse monitor/control 54. An interrupted NAC 58 could drop most or all of the nominal 24 volt signal across the input terminals of the NAC 58, while a shorted NAC 58 could drop close to zero volts. Details of a sense circuit configuration within the reverse monitor/control 54 determine actual results, although it may be desirable that a range of results for nonfaulted systems be readily distinguished from results for likely failure modes.

In the embodiment shown, a forward-polarity signal applied using a forward drive enable function 40 or 42 provides sufficient power to activate all of the visual and acoustic transducers making up the NAC 58. In a typical embodiment, $R_T$ 64 may have a small enough conductivity compared to the plurality of loads 62 in parallel that the current through $R_T$ 64 in forward drive mode is negligible.

An AUX load connected in place of a NAC 58 load may be specified to receive no reverse monitor signal, and may therefore neither require a reverse isolation diode 60 nor benefit from circuit integrity verification. An AUX load having a drive embodiment configured according to typical regulations may receive forward-biased power continuously, i.e., independently of alarm events, whenever the power supply is active. In other embodiments, the AUX load may receive power until a moment of or a selected time after an alarm event, or beginning after occurrence of an alarm event and continuing for a selected time. AUX load power may be applied, in one of many possible examples, to activate an electromagnet to hold a fire door open. In embodiments providing continuous AUX load power, a separate function such as a signal from a second NAC/AUX channel may allow an alarm event to release the door and allow a closer to draw the door shut. AUX applications are limited only by end user ingenuity and power constraints.

FIG. 2 shows a timing diagram 70 for a typical NAC load and the regulations with which a worst-case NAC load complies. Regulations in some jurisdictions stipulate a nominal 24 volt NAC excitation voltage with a steady state current limit $I_{NACSS}$ 72 determined by power supply designer preference, appropriate to powering a NAC load such as ten notification appliances (NAs) wired in parallel. For a user configuration wherein each appliance draws a steady-state 100 mA, for example, each of the one or more steady-state NAC loads $I_{NACSS}$ 72 supported by a power supply is one ampere during alarm operation.

Also by regulation, inrush transient $I_{INRUSH}$ 74 for each NA string is limited to ten times the steady-state NAC load, which is 10 A in the embodiment shown. The $I_{INRUSH}$ 74 load is required to persist for a time $t_{INRUSH}$ 76 not longer than 16.6 msec, and to recur with a time interval $t_{REP}$ 78 having a rough order of magnitude of one second, as determined by (separately regulated) synchronized internal timing components of the electronic devices comprising each NA.

It is to be understood that a fire alarm power supply can be designed to meet sets of performance requirements over a broad range while employing the invention. The specific requirements referred to herein, while directly applicable both to the embodiment described and to specific fire alarm environments, are not to be viewed as limiting with respect to the invention.

FIG. 3 shows event timing and loading for an AUX load function controlled using the inventive apparatus and method. In order to illustrate a variety of attributes of the inventive apparatus in a simplified timing diagram, the example in FIG. 3 shows a short-circuit fault that occurs spontaneously at an indeterminate time after application of power to an AUX load.

AUX loading is limited by designer option in the embodiment shown to a steady state current output $I_{AUXSS}$ 80 of one ampere per output circuit. While providing inrush current limiting to ten times the steady state output is feasible, it may be preferred in view of existing specification requirements to establish a peak AUX current $I_{AUXPEAK}$ 82 of eight amperes. In the specification, the limit is only imposed after five seconds, with no limit before this. The inventive apparatus accommodates this specification while providing additional protections to loads and systems.

The AUXLOAD 88 waveform of FIG. 3 shows an initial condition of no output, followed by a steady-state current $I_{AUXSS}$ 80 at the limit of one ampere beginning at a time $t_0$ 84. A hard short circuit fault event at a time $t_{FAULT}$ 86, for example, causes an initial load current limited to the final specification value of $I_{AUXPEAK}$ 82. Line and load impedance attributes may permit current overshoot in the form of ringing, inhibited by damping, but in realizable embodiments, source energy limitations substantially limit peak amplitude and duration.

In the embodiment shown, the SAMPLE 90 pulse waveform, which may exist only as a timing function within the processor functional block 36 of FIG. 1, represents a uniform interval for measuring the analog level of the AUXLOAD 88 signal. SAMPLE 90 pulses at times $t_1$ 92, $t_2$ 94, and $t_3$ 96 will trigger measurements showing acceptable levels on AUXLOAD 88. After $t_{FAULT}$ 86, the next SAMPLE 90 pulse at time $t_4$ 98 will detect excessive current. In a preferred embodiment, allowance for a capacitive inrush waveform 100, shown in FIG. 4, may require that a second SAMPLE 90 pulse at time $t_5$ 102 be used to repeat the measurement at $t_4$ 98. If the amplitude measured at $t_5$ 102 remains higher than an allowable capacitive tail would predict, that is, if a shutdown threshold has been exceeded, then a shutdown rule may be invoked within the processor functional block 36 of FIG. 1, whereby the processor 36 deenergizes the AUX current limited output enable function, shown as the second enable block 42 in FIG. 1. The AUXLOAD 88 signal then goes to zero after a processing interval following sample time $t_5$ 102.

In some embodiments, a retry interval $t_{RETRY1}$ 104 such as 90 seconds may be assigned, after which the processor functional block 36 of FIG. 1 can reenergize the AUXLOAD 88 signal as shown in FIG. 3. If tests at times such as $t_8$ 106 and $t_9$ 108 show current exceeding a desired level, the output may be deenergized again. This process may be repeated: if a subsequent retry, such as at time $t_{RETRY2}$ 110 produces a successful outcome as tested at $t_{12}$ 112 and $t_{13}$ 114, then the output may be left active indefinitely, with SAMPLE 90 pulses continuing to initiate tests.

It is to be understood that timing for SAMPLE 90 pulses may be keyed to the number of channels in the power supply 10, the conversion time of an analog to digital converter function of the processor block 36, processor speed versus operational routine complexity, power consumption goals, and other considerations such as user preference for fault latency. At a lower limit for speed, specification requirements may dictate an allowed latency, or stress tolerance in critical components may be traded off against essentially continuous power consumption in the processor block 36.

Figure 5:
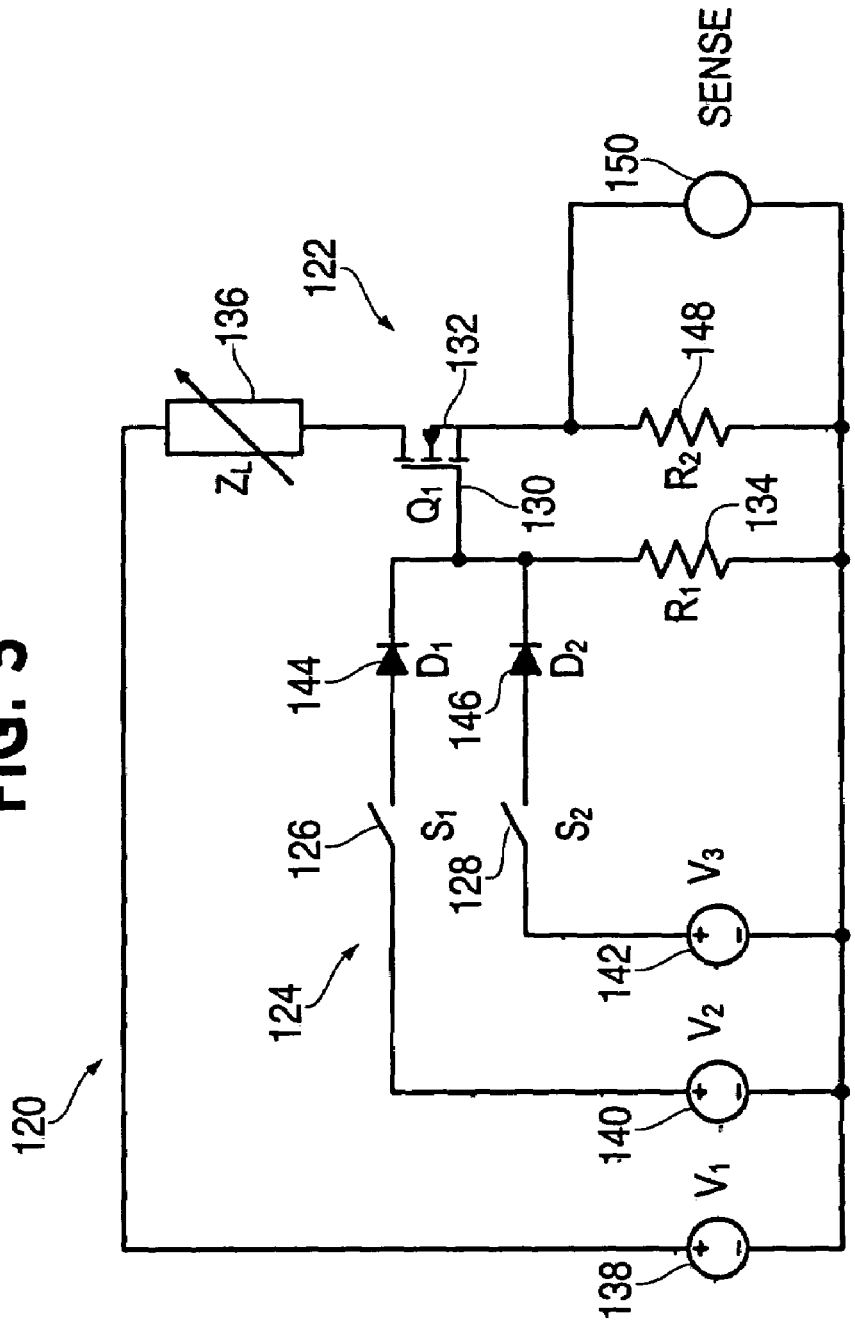
FIG. 5 is a diagram showing output drive and limit functions in schematic form for a notification appliance circuit power supply.

FIG. 5 shows in schematic form 120 the output drive circuit 122 and the limit functions 124. When $S_1$ 126 and $S_2$ 128 are not applying their respective voltages to the gate 130 of MOSFET $Q_1$ 132, resistor $R_1$ 134 holds the $Q_1$ gate 130 low, the circuit is nonconducting, and no power is applied to load $Z_L$ 136. When either $S_1$ 126 or $S_2$ 128 applies a voltage to the gate 130 of $Q_1$ 132, the circuit conducts, so that the voltage across $Z_L$ 136 is roughly equal to the supply voltage $V_1$ 138 less both the drain-to-source voltage of $Q_1$ 132 and $V_{R2}$, the voltage developed across $R_2$ 148. The applied voltage $V_2$ 140 or $V_3$ 142 would not affect the voltage across $Z_L$ 136 unless $V_{R2}$ started to approach the gate voltage of $Q_1$ 132, which would initiate current limiting. If the conductivity of $Z_L$ 136 increases—i.e., the resistance decreases—as in an overload or a wiring error, then $V_{R2}$ increases as current increases. When $V_{R2}$ roughly equals the voltage applied to the $Q_1$ gate 130, the load current limits at a value somewhat lower than $V_2/R_2$ or $V_3/R_2$, as determined largely by the properties of $Q_1$ 132. Changing the value of the active one of $V_2$ 140 and $V_3$ 142 or changing the value of $R_2$ 148 will adjust at least one of the limit current values. The $R_2$ 148 voltage, detected by the SENSE function 150, can also be used, for example, by an analog sensor in the control circuit 36 of FIG. 1, to measure instantaneous load current and to track load current over time, allowing load monitoring independent of the current limit function.

The switches and voltage sources shown as $S_1$ 126, $S_2$ 128, $V_1$ 138, $V_2$ 140, and $V_3$ 142 in FIG. 5 are abstracted; these functions may preferably be realized with semiconductor switches, amplifiers, and voltage divider resistors. Similarly, diodes $D_1$ 144 and $D_2$ 146 may not be required as discrete components in some embodiments, but may be implemented literally or as embedded functions to isolate the applied control voltages $V_2$ 140 and $V_3$ 142 at designer preference. Control of $Q_1$ gate 130 drive circuitry preferably resides in the control circuit 40 or 42 of FIG. 1 as directed by the processor block 36. A current sense function 48, sensing load current through $Z_L$ 136 of FIG. 5 by measuring the voltage drop across the drain resistor $R_2$ 148 in real time, may be applied to interrupt control voltages $V_2$ 140 and $V_3$ 142 according to timing diagrams FIGS. 2 through 4.

Control flow for the circuit in FIG. 5 is discussed above regarding FIGS. 2 through 4. Stored procedural routines within the processor functional block 36 of FIG. 1 can interpret settings of configuration switches 52 of FIG. 1 to activate one of a plurality of realizable drive circuits equivalent to $S_1$ 126 and $S_2$ 128 of FIG. 5 as appropriate for preferred load limits for NAC and AUX loads. This activity is performed in conjunction with presentation of alarm signals detected by the bidirectional alarm command and fault signal interface 50 of FIG. 1. Other elements of the stored routines can apply reverse current, as represented by the reverse monitor/control 54, to sense NAC integrity, and can monitor forward or reverse current using the current sense function 48. Discrete current sense events may be scheduled to occur at regular intervals, such as once every 4 msec for each of a plurality of NAC/AUX channels, at least during normal operation.

In addition to current sensing during normal operation, support for special tests may be desirable. For example, during events such as alarm activation, current sensing may be desirable to verify load characteristics. Results of successive tests applied to channels that exhibit high currents during tests shortly after the beginning of an event may be compared to stored profiles. Such test comparisons may be useful in some embodiments to distinguish between capacitive decay in a load and a short circuit, for example.

Where the power supply is intended for applications other than those subject to specific fire alarm regulations, any combination of voltage, steady-state current, inrush ratio, inrush duration, recurrence interval, and maximum current per load circuit may be assigned as required for each application. For each such application, details of drive circuit component choice and limit circuit configuration may be distinct.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A power supply for driving alarm notification appliances, comprising:
   a driver circuit configured to apply power to an electrical load;
   a first current limited drive enable circuit configured to activate the driver circuit and to establish a first upper drive limit for the driver circuit;
   a second current limited drive enable circuit configured to activate the driver circuit and to establish a second upper drive limit for the driver circuit;
   a drive limit selection criterion;
   a drive level sensor configured to provide to the drive control function an indication of a drive level in the driver circuit;
   a drive control function comprising an analysis sequence wherein the drive level indication from the drive level sensor is compared to a time versus drive level profile, and a shutdown rule wherein at least one shutdown threshold is defined for a drive level indication with respect to the time versus drive level profile, wherein a drive limit imposed on the driver circuit is determined at least in part by the selection criterion.

2. The power supply of claim 1, wherein the drive control function further comprises a drive shutdown function that deactivates a drive enable circuit in response to a shutdown rule.

3. The power supply of claim 2, wherein the drive control function further comprises a retry function that reactivates a drive enable circuit previously deactivated in response to a shutdown rule.

4. The power supply of claim 3, wherein the drive control function further comprises a drive recovery scheduler, wherein activation of shutdown function and retry function events is determined at least in part by a time-dependent sequence.

5. The power supply of claim 1, further comprising an activation trigger input function, wherein a signal applied to the power supply initiates activation of a drive enable circuit.

6. The power supply of claim 1, further comprising a reverse drive circuit configured to apply a direct-current signal to the electrical load with a polarity reversed from a polarity of direct-current power applied to the electrical load by the driver circuit.

7. The power supply of claim 6, further comprising a reverse load level sense function, wherein a reverse load level sense function output signal has at least one value corresponding to an amplitude for a reverse level pass status, and has at least one value corresponding to an amplitude for a reverse level fail status.

8. The power supply of claim 7, further comprising:
a fault detection function, wherein at least one condition within the power supply is interpreted as a power supply fault;
a fault report output, wherein an externally observable indication of a fault condition within the power supply is presented;
a fault report holdoff function, wherein absence of any detected power supply fault blocks the fault report output; and
a fault report disable function, wherein the fault report output is selectably prevented from reporting at least one existing fault.

9. A method for supplying power to drive alarm notification appliances, comprising:
providing power to an electrical load;
establishing a first current limited enablement for providing power to the electrical load;
establishing a second current limited enablement for providing power to the electrical load;
providing a criterion for selection between the first enablement and the second enablement; and
controlling drive current applied to the load, wherein selection of an enablement current limit is determined at least in part by the criterion for selection, wherein controlling drive current further comprises detecting a drive current level applied to the electrical load, analyzing detected drive current with respect to a time versus drive current profile, and establishing a shutdown rule, wherein at least one shutdown threshold for drive current with respect to the time versus drive current profile is defined.

10. The method for supplying power of claim 9, wherein controlling drive current further comprises deactivating a drive enable circuit in response to a shutdown rule.

11. The method for supplying power of claim 10, wherein controlling drive current further comprises reactivating a drive enable circuit previously deactivated in response to a shutdown rule.

12. The method for supplying power of claim 11, wherein controlling drive current further comprises scheduling drive recovery, wherein deactivating and reactivating drive enable circuits is controlled at least in part by a time-dependent sequence.

13. The method for supplying power of claim 9, further comprising providing an activation-trigging input, wherein an externally applied input initiates the supplying of power to the electrical load.

14. The method for supplying power supply of claim 9, further comprising applying a direct-current signal to the electrical load with a polarity reversed from a polarity of direct-current power applied to the electrical load by the driver circuit.

15. The power supply of claim 14, further comprising sensing a reverse load signal level, wherein a reverse load signal has at least one allowable amplitude range for a reverse load signal pass status, and has at least one amplitude range corresponding to a reverse load signal fail status.

16. The method for supplying power of claim 15, further comprising:
detecting a fault, wherein at least one condition within the power supply is interpreted as a capability fault in the supplying of power to the load;
indicating in the form of an externally observable signal a capability fault in the supplying of power to the load;
holding off reporting a fault, wherein absence of any detected power supply fault blocks indication of a fault; and
disabling reporting a fault, wherein indicating at least one capability fault is selectably prevented.

* * * * *